United States Patent [19]
Ohta

[11] Patent Number: 5,943,349
[45] Date of Patent: Aug. 24, 1999

[54] VARIABLE WAVELENGTH LASER DEVICE

[75] Inventor: Katsushi Ohta, Tokyo, Japan

[73] Assignee: Ando Electric Co., Ltd., Tokyo, Japan

[21] Appl. No.: 09/102,495

[22] Filed: Jun. 22, 1998

[30] Foreign Application Priority Data

Jun. 27, 1997 [JP] Japan ................................. 9-172503

[51] Int. Cl.[6] .................................................. H01S 3/10
[52] U.S. Cl. ................................ 372/20; 372/32; 372/6; 372/49
[58] Field of Search ................................ 372/20, 32, 6, 372/49; 356/376

[56] References Cited

U.S. PATENT DOCUMENTS

| | | | |
|---|---|---|---|
| 4,796,997 | 1/1989 | Svetkoff et al. | 356/376 |
| 5,651,018 | 7/1997 | Mehuys et al. | 372/32 |

FOREIGN PATENT DOCUMENTS 4-69987   5/1992   Japan .

Primary Examiner—Leon Scott, Jr.
Attorney, Agent, or Firm—Fish & Richardson P.C.

[57] ABSTRACT

The present invention has as an object thereof to provide a variable wavelength laser device which has superior productivity and a simple structure, and is capable of obtaining laser light which is highly stable and has a variable wavelength. In order to attain the above object, the present invention is provided with a laser diode 30 having a non-reflective film formed on one end surface thereof and having a total reflection film formed on the other end surface thereof; a light feedback part 44 which is formed externally to the laser diode 30, reflects a portion of the laser light emitted from laser diode 30 and feeds this light back into laser diode 30; and a variable wavelength band pass filter 40, which is disposed between laser diode 30 and light feedback part 44, has transmission characteristics such that light in a specified wavelength band is transmitted, and has a variable wave transmission band.

6 Claims, 3 Drawing Sheets

VARIABLE WAVELENGTH LASER DEVICE

BACKGROUND OF THE INVENTION

1. Field of the Invention

The present invention relates to a variable wavelength laser device, and in particular, relates to a variable wavelength laser device in which an external resonator is formed.

2. Background Art

Conventionally, variable wavelength laser devices are known in which a non-reflective film is formed on one end surface of a Fabry-Perot type laser diode, an element having wavelength selectivity is provided external to the laser diode on the non-reflective film, and feedback is applied to the laser diode, whereby an external resonator is formed in the region to the other end face. Such a variable wavelength laser device generates a laser when the gain conditions and phase conditions overcome the losses such as the reflection loss, scattering loss, and the like.

In this way, the laser light having a wavelength freely selected from among the light emitted from the laser diode generating the laser is selected by means of an element having wavelength selectivity, and this is fed back to the laser diode, and thereby, the wavelength is made variable.

FIGS. 4 and 5 are structural diagrams showing examples of conventional variable wavelength laser devices.

First, FIG. 4 will be described. In FIG. 4, reference 10 indicates the laser diode; a non-reflective film 10a is formed on one end surface thereof, while a low reflection film 10b is formed on the other end surface thereof. The reflectance of the low reflection film 10b is on the level of a few percent. A lens 12, a variable wavelength band pass filter 14, and a total reflection mirror 16 are formed in that order on the optical axis of laser diode 10 and on the side on which the non-reflective film 10a is formed.

Lens 12 converts the laser light emitted by the laser diode 10 to parallel rays. The variable wavelength band pass filter 14 has transmission characteristics such that only light having a specified wavelength passes therethrough, and this filter is disposed so as not to be perpendicular to the optical axis of the laser diode 10. Furthermore, the total reflection mirror 16 totally reflects light which is incident thereto. A resonator is formed by means of the total reflection mirror 16 and the end surface of laser diode 10 on which low reflection film 10b is formed.

Furthermore, a lens 18 and an optical fiber 20 are disposed on the optical axis of laser diode 10 at the side on which low reflection film 10b is formed. Lens 18 causes the laser light emitted from the end surface of laser diode 10 on which low reflection film 10b is formed to enter one end of the optical fiber 20. An emitter port is provided at the other end of optical fiber 20, and the laser light transmitted through optical fiber 20 is emitted from this port.

In the structure described above, when laser light is emitted from the laser diode 10, the laser light emitted from the end surface on which non-reflective film 10a is formed is converted to parallel rays by lens 12. When the converted parallel rays pass through the variable wavelength band pass filter 14, only the specified wavelength component is transmitted. The wavelength component which does not pass through variable wavelength band pass filter 14 is reflected; however, the variable wavelength band pass filter 14 is disposed so as not to be perpendicular to the optical axis of laser diode 10, so that there is no feedback of this light to laser diode 10.

The wavelength component which is transmitted through variable wavelength band pass filter 14 is reflected by total reflection mirror 16, and this again enters laser diode 10 via variable wavelength band pass filter 14 and lens 12. A portion of the laser light which enters into laser diode 10 is reflected by low reflection film 10b, and is fed back to laser diode 10, while the remainder of the light is emitted from non-reflective film 10b. In this way, resonance is achieved within the resonator formed by total reflection mirror 16 and low reflection film 10b.

The laser light omitted from the end surface on which low reflection film 10b is formed is focused by lens 18, and enters optical fiber 20 from one end thereof. The laser light which enters in this way is transmitted through optical fiber 20 and is emitted from emitter port 20a.

In the above structure, by making the transmission wavelength of the variable wavelength band pass filter 14 variable, the wavelength of the laser light fed back into laser diode 10 changes, and the resonance conditions change, and thereby, lasers can be generated at different wavelengths, so that it is also possible to change the wavelength of the laser light emitted from optical fiber 20a.

Next, the variable wavelength laser device shown in FIG. 5 will be explained; however, those parts which are identical to those of the variable wavelength laser device shown in FIG. 4 are given the same reference numbers, and an explanation thereof will be omitted here. The difference between the variable wavelength laser device shown in FIG. 5 and the variable wavelength laser device shown in FIG. 4 is that a grating 22 is provided in place of the variable wavelength pass filter 14 and the total reflection mirror 16 in FIG. 4.

Grating 22 has the characteristic of reflecting a specific wavelength component in a specified direction depending on the angle of incidence of the parallel rays which enter. Accordingly, by changing the angle thereof with respect to the incident parallel rays, it is possible to change the wavelength of the laser light fed back into the laser diode 10.

In the structure described above, the laser light emitted from the end surface on which non-reflective film 10a is formed is converted to parallel rays by lens 12, and this light is applied to grating 22. The wavelength of laser light reflected by grating 22 and which reenters laser diode 10 is determined by the angle formed by the parallel rays applied to grating 22 and the grating. A portion of the light which enters laser diode 10 is fed back into laser diode 10 at the end surface on which low reflection film 10b is formed, and the remainder of the light is emitted to the exterior.

In this way, a resonator is formed by grating 22 and the end surface on which low reflection film 10b is formed, and laser light having a wavelength matching the resonance conditions of the resonator is emitted. The laser light emitted from the end surface on which low reflection film 10b is formed is focused by lens 18, and is emitted from emitter port 20a via optical fiber 20. The wavelength of the laser light emitted from emitter port 20a may be changed by means of altering the angle formed by the grating 22 and the parallel rays converted by lens 12.

In the conventional variable wavelength laser device shown in FIGS. 4 and 5, in order to cause the generation of a laser, it is necessary to conduct a high ratio of light feedback to the active layers of the laser diode. Generally, the active layers formed on laser diode 10 have a cross-sectional area of approximately 1 micrometer×a few tens of nanometers in the plane perpendicular to the optical axis of laser diode 10. Accordingly, because this cross-sectional area is extremely small, it is necessary to position the optical members constituting the device with a high degree of precision.

With the cross-sectional area described above, even if the light is focused by a lens and applied, the coupling coefficients of the light do not become very large. Furthermore, in order to increase the coupling coefficients, conventionally, advanced optical axis adjustment technology was required for the arrangement of the optical parts and advanced fixation technology was required to increase the reliability, so that the structure of the parts also became complex, and this caused obstacles in terms of productivity.

Concretely, to explain based on the example shown in FIG. 4, in order to feed back the laser light emitted from laser diode 10 back into laser diode 10, it was necessary to position lens 12, variable wavelength band pass filter 14 and total reflection mirror 16 with a high degree of precision, and it was also necessary to adjust lens 18 and optical fiber 20.

SUMMARY OF THE INVENTION

The present invention was created in light of the above circumstances; it has as an object thereof to provide a variable wavelength laser device which is capable of mass production, has a simple structure and is highly stable, and is capable of obtaining variable wavelength laser light.

In order to solve the above problems, the present invention is provided with: a laser diode, on one end surface of which is formed a non-reflective film, and on the other end surface of which is formed a total reflection film; a light feedback mechanism, which is formed externally to the laser diode, reflects a portion of the laser light emitted from laser diode, and feeds light back into the laser diode; and an optical filter mechanism, which is disposed between the laser diode and the light feedback mechanism, has transmission characteristics such that light in a specified wavelength band is transmitted, and has a variable transmission band.

The effects of the present invention are as follows: special advanced technology is not required, so that superior productivity is obtained, and it is possible to conduct emissions having a highly stable wavelength using a simple structure.

Furthermore, in the present invention, it is preferable that, in the optical filter mechanism, an optical fiber which transmits light entering thereinto be provided, and it is preferable that a lens be provided which focuses the laser light emitted from the laser diode and applies this light to the optical fiber.

Furthermore, in the present invention, it is preferable that, in the optical fiber mechanism, an optical fiber be provided for transmitting the emitted light, and it is preferable that the light feedback mechanism be provided at the end of the optical fiber.

Furthermore, in the present invention, it is preferable that the optical filter mechanism be provided with a variable wavelength band pass filter having a variable transmission band having transmission characteristics such that light in a specified wavelength band is transmitted, and an optical fiber which transmits light passing through the variable wavelength band pass filter to the exterior, and that the light feedback mechanism be formed at the end of the optical fiber.

Furthermore, in the present invention, it is preferable that an optical fiber transmitting inputted light be provided in the optical filter mechanism, and that the optical filter mechanism be provided with a first lens, which converts to parallel rays the laser light emitted from the laser diode, and transmitted through the optical fiber and emitted, and which applies this light to the variable wavelength band pass filter, and with a second lens, which focuses the parallel rays transmitted through the variable wavelength band pass filter onto the light feedback mechanism.

Furthermore, in the present invention, it is preferable that the light feedback mechanism comprise a dielectric multi-layer film.

DETAILED DESCRIPTION OF THE PREFERRED EMBODIMENTS

Hereinbelow, the embodiments of the present invention will be explained in detail with reference to the figures.
First Embodiment FIG. 1 shows the structure of a variable wavelength laser device in accordance with a first embodiment of the present invention.

Figure 1:
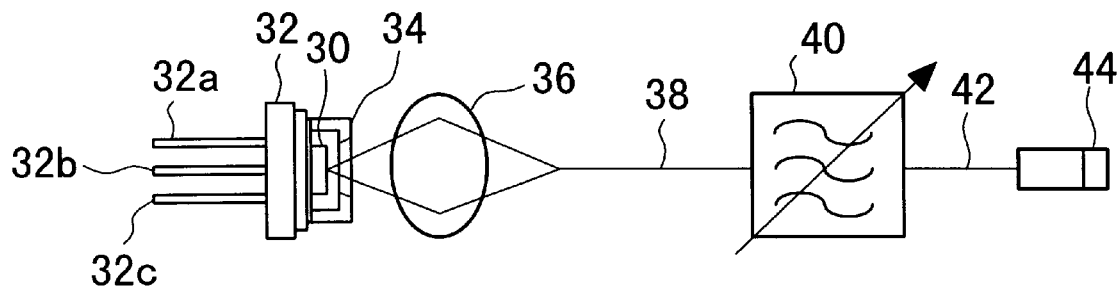
FIG. 1 shows the structure of a variable wavelength laser device in accordance with a first embodiment of the present invention.

In FIG. 1, laser diode 30 is affixed to stem 32, and is electrically connected to lead wires 32a–32c, and is sealed by means of cap 34, so that it is isolated from the exterior atmosphere. A window comprising a transparent member for emitting the laser light emitted from the laser diode 30 is formed in cap 34.

Figure 2:
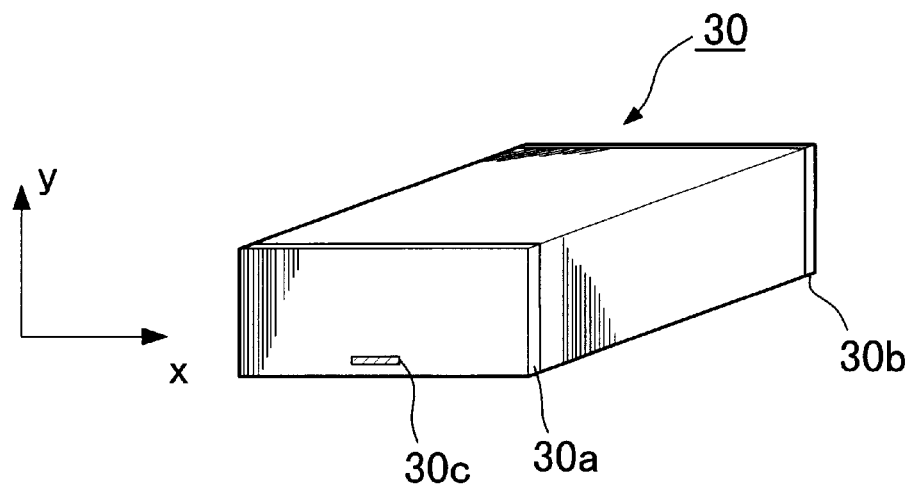
FIG. 2 is an angled view of the laser diode 30.

FIG. 2 is an angled view of the laser diode 30. As shown in FIG. 2, a non-reflective film 30a having a reflectance of 0.1% or less is provided on one end surface of laser diode 30, while on the other end surface thereof, a high reflection film 30b having a reflectance of 90% or more is provided. The portion indicated by reference 30c in the figure is the active layer. This active layer 30c comprises a material having a higher refractive index than that of the material used for the surrounding cladding layer, and the structure is impervious to light with respect to the x axis direction and the y axis direction.

The laser diode 30 is disposed so that the end surface on which non-reflective layer 30 is formed faces the window formed in the cap 34 in FIG. 1.

In FIG. 1, reference 36 indicates a lens; this serves to focus the laser light emitted from laser diode 30 onto one end of the optical fiber 38. A variable wavelength band pass filter 40 is provided at the other end of optical fiber 38. This variable wavelength band pass filter 40 has a transmission band half value width of approximately 0.5 nm. It is easily possible to alter the transmission band. The variable wavelength band pass filter 40 transmits the specified wavelength $\lambda_a$ from the light inputted thereinto.

One end of optical fiber 40 is connected to the variable wavelength band pass filter 40. An light feedback part 44 is connected to this optical fiber 40. This light feedback part 44 comprises a dielectric multilayer film, and has light reflection and transmission characteristics such that, for example, the reflectance thereof is 50%, and the transmittance thereof is 50%. The dielectric multi-layer film described above is formed, for example, from a multi-layer film of $Ti/SiO_2$.

In the above structure, by applying an electric current to laser diode 30, spontaneously emitted light is generated. The light which is transmitted in the direction of the total reflection film 30a within the active layer 30c of laser diode 30 is reflected by total reflection film 30a, and is transmitted through active layer 30c in the direction in which non-reflective film 30a is provided. The light transmitted in the direction in which non-reflective film 30a is provided enters lens 36 via the window formed in cap 34, and is focused. The focused light is transmitted through optical fiber 38 and enters variable wavelength band pass filter 40. Among the light which enters, only that light having a wavelength within the transmission band of the variable wavelength band pass filter 40 passes through variable wavelength band pass filter 40, and enters optical fiber 42.

A portion of the light which enters optical fiber 42 is reflected by the light feedback part 44 formed at the end part, and this light enters laser diode 30 via variable wavelength band pass filter 40, optical fiber 38, and lens 36. The light which enters laser diode 30 is transmitted through active layer 30c, and is reflected by total reflection film 30b, and the operation described above is repeated.

In this way, a resonator is formed by the total reflection film 30b formed in laser diode 30 and the optical fiber part 44 formed at optical fiber 42, and by resonating light within this resonator, laser generation occurs, and laser light is emitted to the exterior from light feedback part 44.

In order to change the wavelength of the laser light emitted from light feedback part 44, the transmission band of the variable wavelength band pass filter 40 may be changed, and the resonance characteristics within the resonator may be altered.

Furthermore, if the reflectance of light feedback part 44 is changed, and the amount of light returning to the laser diode 30 is kept at approximately 5%, high output laser light identical to that of a standard laser diode is obtained.

On the other hand, if the amount of light returning to laser diode 30 is set to 20% or more, laser light having a broad wavelength variable width is obtained.

The variable wavelength laser device having the structure described above does not require the highly precise adjustment of optical parts as was conventionally the case, so that it has superior productivity.

Furthermore, by combining a Peltier element or a thermistor or the like with the variable wavelength laser device having the structure described above and conducting temperature regulation of the laser diode, it is possible to obtain laser light having a highly stable wavelength.

Second Embodiment

Figure 3:
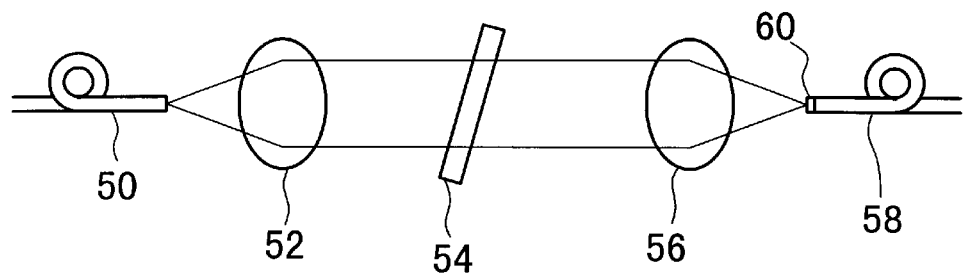
FIG. 3 shows a portion of the structure of a variable wavelength laser device in accordance with a second embodiment of the present invention.
Figure 4:
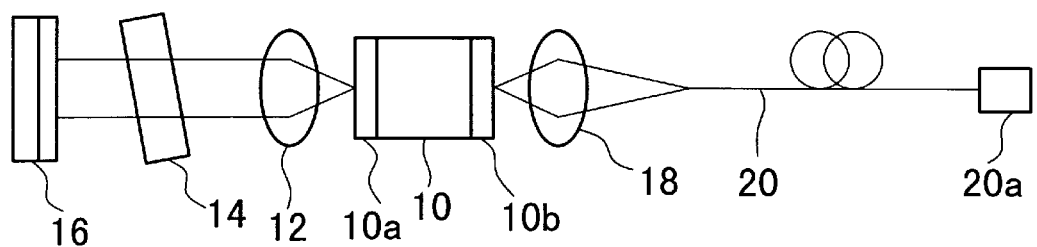
FIG. 4 is a structural diagram showing an example of a conventional variable wavelength laser device.
Figure 5:
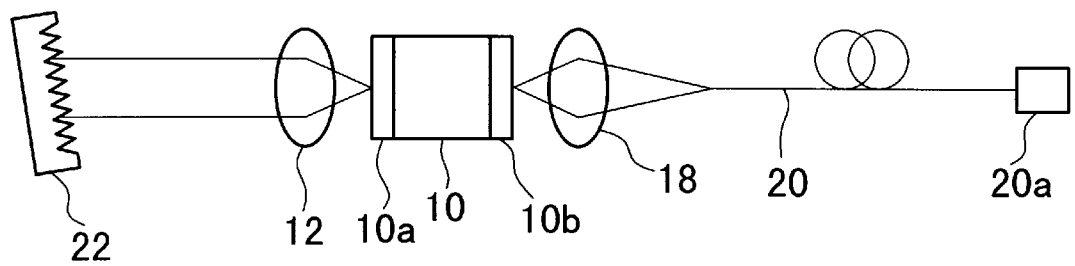
FIG. 5 is a structural diagram showing an example of a conventional variable wavelength laser device.

Next, a variable wavelength laser device in accordance with the second embodiment of the present invention will explained. FIG. 3 shows a part of the structure of a variable wavelength laser device in accordance with the second embodiment of the present invention.

The differences between the variable wavelength laser device in accordance with the second embodiment of the present invention depicted in FIG. 3 and the variable wavelength laser device in accordance with the first embodiment of the present invention shown in FIG. 1 are that, in place of the variable wavelength band pass filter 40, a lens 52, a variable wavelength band pass filter 54, a lens 56, and an optical fiber 58 with a light feedback part 60 thereon are provided.

Optical fiber 50 is connected with optical fiber 38, and optical fiber 58 is connected with optical fiber 42. Furthermore, the light feedback part 44 in FIG. 1 is omitted here.

Light transmitted through optical fiber 38 is applied from one end of optical fiber 50. Lens 52 converts the laser light emitted from optical fiber 50 into parallel rays. The variable wavelength band pass filter 54 has a transmission band half value width of, for example, 0.5 nm, and this is disposed between lens 52 and lens 56. Lens 56 focuses the parallel rays transmitted through variable wavelength band pass filter 54 on one end of optical fiber 58.

The light feedback part 60 is formed on one end of optical fiber 58. This light feedback part 60 is identical to the light feedback part 44 described above; it has a dielectric multilayer film structure, and has light reflection and transmission characteristics such that the reflectance thereof is, for example, 50%, and the transmittance thereof is 50%. The laser light transmitted through this light feedback part 60 and applied to optical fiber 58 is transmitted through optical fiber 58 and emitted to the exterior.

In other words, the variable wavelength laser device in accordance with the second embodiment of the present invention depicted in FIG. 3 has the light feedback part disposed within the variable wavelength band pass filter 40 in FIG. 1.

In this structure, by applying an electric current to laser diode 30, spontaneously emitted light is generated. The light transmitted in the direction of the total reflection film 30a within the active layer of laser diode 30 is reflected by means of total reflection layer 30a, and is transmitted within active layer 30c in the direction in which non-reflective film 30a is provided. The light transmitted in the direction in which non-reflective film 30a is provided enters lens 36 via the window formed in cap 34, and is focused. The focused light is transmitted through optical fiber 38 and optical fiber 50, and is emitted from the end part of optical fiber 50.

The light emitted from optical fiber 30 is converted to parallel rays by lens 52, and only that light having a specified wavelength is transmitted through variable wavelength band pass filter 54, and enters lens 56. The parallel rays transmitted through the variable wavelength band pass filter 54 are focused by lens 56, and applied to light feedback part 60. 50% of the light entering light feedback part 60 is reflected, while 50% thereof is transmitted through light feedback part 60, and enters an optical fiber 58.

The light reflected by light feedback part 60 enters laser diode 30 via lens 56, variable wavelength band pass filter 54, lens 52, optical fibers 50 and 38, and lens 36. The light which enters laser diode 30 is transmitted through active layer 30c, and is reflected by total reflection film 30b, is again transmitted through active layer 30c, and is emitted from the end surface on which non-reflective film 30a is formed. Thereafter, the operation described above is repeated.

In this way, a resonator is formed by the total reflection film 30b formed on laser diode 30 and the light feedback part 60 formed at optical fiber 58, and by resonating light in this resonator, laser generation occurs, and the laser light which passes through light feedback part 60 is transmitted through optical fibers 58 and 42 and is emitted to the exterior.

In order to change the wavelength of the laser light which is emitted to the exterior, the transmission band of the variable wavelength band pass filter 54 may be altered, and the resonance characteristics within the resonator may be changed.

Furthermore, in the same way as in the first embodiment, if the reflectance of optical fiber part 60 is changed and the amount of light returning to laser diode 30 is set at approximately 5%, then a large output laser light identical to that of a standard laser diode is obtained.

On the other hand, if the amount of light returning to laser diode 30 is 20% or more, then laser light having a broad wavelength variable width is obtained.

The variable wavelength laser device having the structure described above does not require the highly precise adjustment of the optical parts which was conventionally necessary, so that it has superior productivity.

Furthermore, by combining a Peltier element or a thermistor or the like with the wavelength variable laser device having the structure described above, and regulating the temperature of the laser diode 30, it is possible to obtain laser light having a highly stable wavelength.

What is claimed is:

1. A variable wavelength laser device which is provided with:

a laser diode having a non-reflective film formed on one end surface thereof and a total reflection film formed on another end surface thereof;

a light feedback means for reflecting a portion of laser light emitted from said laser diode and feeding this light back to said laser diode, which is formed externally to said laser diode; and an optical filter means having a variable transmission band which is disposed between said laser diode and said light feedback means and has transmission characteristics such that light within a specified wavelength band is transmitted.

2. A variable wavelength laser device in accordance with claim 1, wherein an optical fiber for transmitting inputted light is provided in said optical filter means, and a lens is provided which focuses laser light emitted from said laser diode and applies this to said optical fiber.

3. A variable wavelength laser device in accordance with claim 1, wherein an optical fiber for transmitting emitted light is provided in said optical filter means, and said light feedback means is provided at an end part of said optical fiber.

4. A variable wavelength laser device in accordance with claim 1, wherein said optical filter means is provided with a variable wavelength band pass filter having a variable transmission band and having transmission characteristics such that light within a specified wavelength band is transmitted, and an optical fiber which transmits to the exterior light through said variable wavelength band pass filter; and said light feedback means is formed at an end part of said optical fiber.

5. A variable wavelength laser device in accordance with claim 4, wherein an optical fiber which transmits inputted light is provided in said optical filter means, and said optical filter means is provided with:

a first lens which converts to parallel rays laser light outputted from said laser diode and transmitted through said optical fiber and applies this to said variable wavelength band pass filter, and a second lens which focuses parallel rays transmitted through said variable wavelength band pass filter onto said light feedback means.

6. A variable wavelength laser device in accordance with claim 1, wherein said light feedback means comprises a dielectric multi-layer film.

\* \* \* \* \*